US006438394B1

(12) United States Patent
Zhang et al.

(10) Patent No.: US 6,438,394 B1
(45) **Date of Patent: *Aug. 20, 2002**

(54) FREQUENCY DEPENDENT INDUCTOR APPARATUS AND METHOD FOR A NARROW-BAND FILTER

(76) Inventors: Dawei Zhang, 201 W. California Ave. #43, Sunnyvale, CA (US) 94086; Guo-Chun Liang, 7634 Squirewood Way, Cupertino, CA (US) 95014; Chien-Fu Shih, 1459 Carrett Ct., Rohnert Park, CA (US) 94928

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/706,974

(22) Filed: Sep. 3, 1996

Related U.S. Application Data

(63) Continuation of application No. 08/323,365, filed on Oct. 14, 1994, now abandoned.

(51) Int. Cl.[7] ......................... H03H 7/075; H01B 12/02

(52) U.S. Cl. ....................... 505/210; 505/700; 505/866; 333/99 S; 333/168; 333/175

(58) Field of Search ............................. 333/99 S, 168, 333/175, 185; 505/210, 700, 701, 866

(56) References Cited

U.S. PATENT DOCUMENTS

| | | | | |
|---|---|---|---|---|
| 4,749,963 A | | 6/1988 | Makimoto et al. | 333/246 X |
| 4,881,050 A | * | 11/1989 | Swanson, Jr. | 333/168 X |
| 5,055,809 A | | 10/1991 | Sugawa et al. | 333/219 |
| 5,132,282 A | | 7/1992 | Newman et al. | 505/701 X |
| 5,231,078 A | * | 7/1993 | Riebman et al. | 333/185 X |
| 5,618,777 A | | 4/1997 | Hey-Shipton et al. | 505/210 |

FOREIGN PATENT DOCUMENTS

| | | | | |
|---|---|---|---|---|
| DE | 23 17 375 | | 10/1974 | |
| DE | 4009076 | * | 9/1991 | 333/175 |
| FR | 2577067 | | 8/1986 | |
| JP | 97715 | * | 6/1982 | 333/168 |

OTHER PUBLICATIONS

High–Temperature Superconducting Microwave Devices: Fundamental Issues in Materials, Physics, and Engineering, Nathan Newman and W. Gregory Lyons, Journal of Superconductivity, vol. 6, No. 3, 1993, pp. 119–160.

Lumped Element Filters for Electronic Warfare Systems, D. Morgan and R. Ragland, Microwave Journal, Feb. 1986, pp. 127–136.

35 GHz Downconverter Using HTS Films, Roger Forse and Stephan Rohlfing, 1994 SPIE vol. 2156, pp. 80–87.

A 10 GHz Thin Film Lumped Element High Temperature Superconductor Filter, Daniel G. Swanson, Jr., Roger Forse, and Boo J. L. Nilsson, 1992, IEEE MTT–S Digest, pp. 1191–1193.

Superconducting Narrow Band Pass Filters For Advanced Multiplexers, A. Fathy, D. Kalokitis, V. Pendrick, E. Belohoubek, A. Pique, M. Mathur, 1993 IEEE MTT–S Digest, pp. 1277–1280.

Critical Design Issues in Implementing a YBCO Superconductor X–Band Narrow Bandpass Filter Operating at 77K, A. Fathy, D. Kalokitis, E. Belohoubek, 1991 IEEE MTT–S Digest, pp. 1329–1332.

(List continued on next page.)

*Primary Examiner*—Benny T. Lee

(57) ABSTRACT

The present invention provides for a super-narrow band filter using frequency dependent L-C components. The invention utilizes a frequency dependent L-C circuit with a positive slope k for the inductor values as a function of frequency. The positive k value allows the realization of a very narrow-band filter.

22 Claims, 8 Drawing Sheets

OTHER PUBLICATIONS

Thin–Film Lumped–Element Microwave Filters, Dan Swanson, 1989 IEEE MTT–S Digest, pp. 671–674.

IEEE Transactions on Microwave Theory and Techniques, vol. 19, No. 12, Dec. 1971 New York US, pp. 928–937, C.S. Aitchison et al. "Lumped–circuit elements at microwave frequencies" see figure 3B.

Electronics Letters, vol. 29, No. 17, Aug. 19, 1993 Stevenage GB, pp. 1578–1580, XP 000393812 T. Patzelt et al. "High–temperature superconductive lumped–element microwave allpass sections" see p. 1579, left column, line 37–line 42; FIG. 1.

Applied Physics Letters, vol. 63, No. 6, Aug. 9, 1993 New York US, pp. 830–832, XP 000388555 Y. Nagai et al. "Properties of superconductive bandpass filters with thermal switches" see p. 830, left column, line 17–line 30.

IEEE Spectrum, vol. 30, No. 4, Apr. 1993 New York US, pp. 34–39, XP 000363908 R.B. Hammond et al. "Designing with superconductors" see p. 36, left column, line 29–line 35.

1995 IEEE MTT–S International Microwave Symposium—Digest, vol. 2, May 16–20, 1995 Orlando (US), pp. 379–382, XP 000536924 D. Zhang et al. "Narrowband lumped–element microstrip filters using capacitively–loaded inductors".

* cited by examiner

FREQUENCY DEPENDENT INDUCTOR APPARATUS AND METHOD FOR A NARROW-BAND FILTER

This is a Continuation of application Ser. No. 08/323,365, filed Oct. 14, 1994, now abandoned.

FIELD OF THE INVENTION

The present invention relates generally to filters for electrical signals, more particularly to a narrow band filter using frequency-dependent L-C components, and still more particularly to a super-narrow-band filter on the order of 0.05% which utilizes frequency-dependent L-C components and which is constructed of superconducting materials.

BACKGROUND ART

Narrow-band filters are particularly useful in the communications industry and particularly for cellular communications systems which utilize microwave signals. At times, cellular communications have two or more service providers operating on separate bands within the same geographical area. In such instances, it is essential that the signals from one provider do not interfere with the signals of the other provider(s). At the same time, the signal throughput within the allocated frequency range should have a very small loss.

Additionally, within a single provider's allocated frequency, it is desirable for the communication system to be able to handle multiple signals. Several such systems are available, including frequency division multiple access (FDMA), time division multiple access (TDMA), code division multiple access (CDMA), and broad-band CDMA (b-CDMA). Providers using the first two methods of multiple access need filters to divide their allocated frequencies in the multiple bands. Alternatively, CDMA operators might also gain an advantage from dividing the frequency range into bands. In such cases, the narrower the bandwidth of the filter, the closer together one may place the channels. Thus, efforts have been previously made to construct very narrow bandpass filters, preferably with a fractional-band width of less than 0.05%.

An additional consideration for electrical signal filters is overall size. For example, with the development of cellular communication technology the cell size (e.g., the area within which a single base station operates) will get much smaller—perhaps covering only a block or even a building. As a result, base station providers will need to buy or lease space for the stations. Each station requires many separate filters. The size of the filter becomes increasingly important in such an environment. It is, therefore, desirable to minimize filter size while realizing a filter with very narrow fractional-bandwidth and high quality factor Q. In the past, however, several factors have limited attempts to reduce the filter size.

For example, in narrow-band filter designs, achieving weak coupling is a challenge. Filter designs in a microstrip configuration are easily fabricated. However, very-narrow-bandwidth microstrip filters have not been realized because coupling between the resonators decays only slowly as a function of element separation. Attempts to reduce fractional-bandwidth in a microstrip configuration using selective coupling techniques have met with only limited success. The narrowest fractional-bandwidth reported to date in a microstrip configuration was 0.6%. Realization of weak coupling by element separation is ultimately limited by the feedthrough level of the microstrip circuit.

Two other approaches have been considered for very-narrow-bandwidth filters. First, cavity type filters may be used. However, such filters are usually quite large. Second, filters in stripline configurations may be used, but such devices are usually hard to package. Therefore, by utilizing either of these two types of devices there is an inevitable increase in the final system size, complexity and the engineering cost.

Accordingly, there exists a need for a super-narrow-bandwidth filter having the convenient fabrication advantage of microstrip filters while achieving, in a small filter, the equivalent of the very weak coupling necessary for a super-narrow fractional bandwidth. This objective may be achieved by utilizing a frequency-dependent inductor-based design to achieve the equivalent of very weak coupling.

SUMMARY OF THE INVENTION

The present invention provides for a super-narrow band filter using frequency dependent L-C components. The invention utilizes a frequency dependent L-C circuit with a positive slope k for the inductor values as a function of frequency. The positive k value allows the realization of a very narrow-band filters. Although the example of communications and cellular technology is used herein, such application is only one of many in which the principles of the present invention may be employed. Accordingly, the present invention should not be construed as limited by such examples.

In a preferred embodiment filter, the filter is designed to meet a predetermined transmission response of $S_{21}$ which can be expressed in terms of ABCD matrix parameters:

$$S_{21} = \frac{2\sqrt{Z_1 Z_2}}{Z_2 a + b + Z_1 Z_2 c + Z_1 d}$$

where $Z_1$ and $Z_2$ are input and output impedances; a and d are pure real numbers; and b and c are pure imaginary numbers. As set forth in more detail below, the real numbers a and d depend on the variable $L\omega^2$ (e.g., the inductance times the frequency squared, a well known variable in the art). A frequency transformation may then be introduced which keeps $L\omega^2$ invariant (discussed in further detail below). Thus, a and d, which contribute to the real part of the denominator in $S_{21}$, will remain unchanged. As set forth in more detail below, the imaginary numbers b and c depend on the variable $j\omega$ (e.g., the imaginary number times the frequency, a well known variable in the art). Furthermore, if changes caused by the frequency transformation due to the $j\omega$ part in b and c are small enough (which is exactly equal to zero at the filter passband center, $\omega_0$), then the imaginary part of the denominator in $S_{21}$ will remain invariant also. Accordingly, the whole transmission response $S_{21}$ will remain unchanged after the frequency transformation.

With the availability of high temperature superconductors, filters with circuit Qs of 40,000 are now possible. The present invention, when realized in a high Q embodiment enables super-narrow-band filters not previously possible.

The various features of the present invention include several advantages over prior lumped-element approaches. By way of example, the methodology of the present invention offers very large equivalent values of planar lumped-element inductors without requiring the cross-over of thin films. It also shrinks the filter bandwidth without further reduction of the weak coupling. Third, it saves more wafer area than conventional lumped-element circuits for the same circuit performance.

It will also be appreciated by those skilled in the art that this invention has wide application in narrow-band circuits.

For example, the invention may be used to realize very narrow-band filters; realize large effective values of inductance for narrow-band applications such as DC-bias inductors that block high frequency signals; realize lumped-element circuits with even smaller areas; introduce additional poles for bandpass and low-pass filters; and be used in applications in other high-Q circuits such as superconductor applications.

Therefore, according to one aspect of the present invention, there is provided a narrow-band filter apparatus using frequency transformation, comprising: (a) a capacitive element and (b) an inductive element having an effective inductance and operatively connected to said capacitive element, wherein said effective inductance increases as a function of frequency.

According to another aspect of the invention, there is provided a bandpass filter, comprising: a plurality of L-C filter elements, each of said L-C filter elements comprising an inductor, the inductor having an initial and an effective inductance, and a capacitor in parallel with the inductor, wherein the effective inductance of each of the L-C filter elements is larger than the initial inductance of said inductor and increases with increases in frequency; and a plurality of uncapacitive elements interposed between the L-C filter elements, whereby a lumped-element filter is formed.

These and other advantages and features which characterize the present invention are pointed out with particularity in the claims annexed hereto and forming a further part hereof. However, for a better understanding of the invention, the advantages and objects attained by its use, reference should be made to the drawing which forms a further part hereof, and to the accompanying descriptive matter, in which there is illustrated and described preferred embodiments of the present invention.

BRIEF DESCRIPTION OF THE DRAWING

In the Drawing, wherein like reference numerals and letters indicate corresponding elements throughout the several views.

DETAILED DESCRIPTION OF THE PREFERRED EMBODIMENT

The principles of this invention apply to the filtering of electrical signals. The preferred apparatus and method which may be utilized to practice the invention include the utilization of frequency-dependent L-C components and a positive slope of inductance relative to frequency. That is, the effective inductance increases with increasing frequency. It will be appreciated by those skilled in the art that in the usual transmission line realization of inductors, the inductor slope "k" has a negative value due to the capacitance to ground.

As noted above, a preferred use of the present invention is in communication systems and more specifically in cellular communications systems. However, such use is only illustrative of the manners in which filters constructed in accordance with the principles of the present invention may be employed.

A detailed description of the present invention will now be deferred pending a brief discussion of the theory of operation.

Theory

Figure 1A:
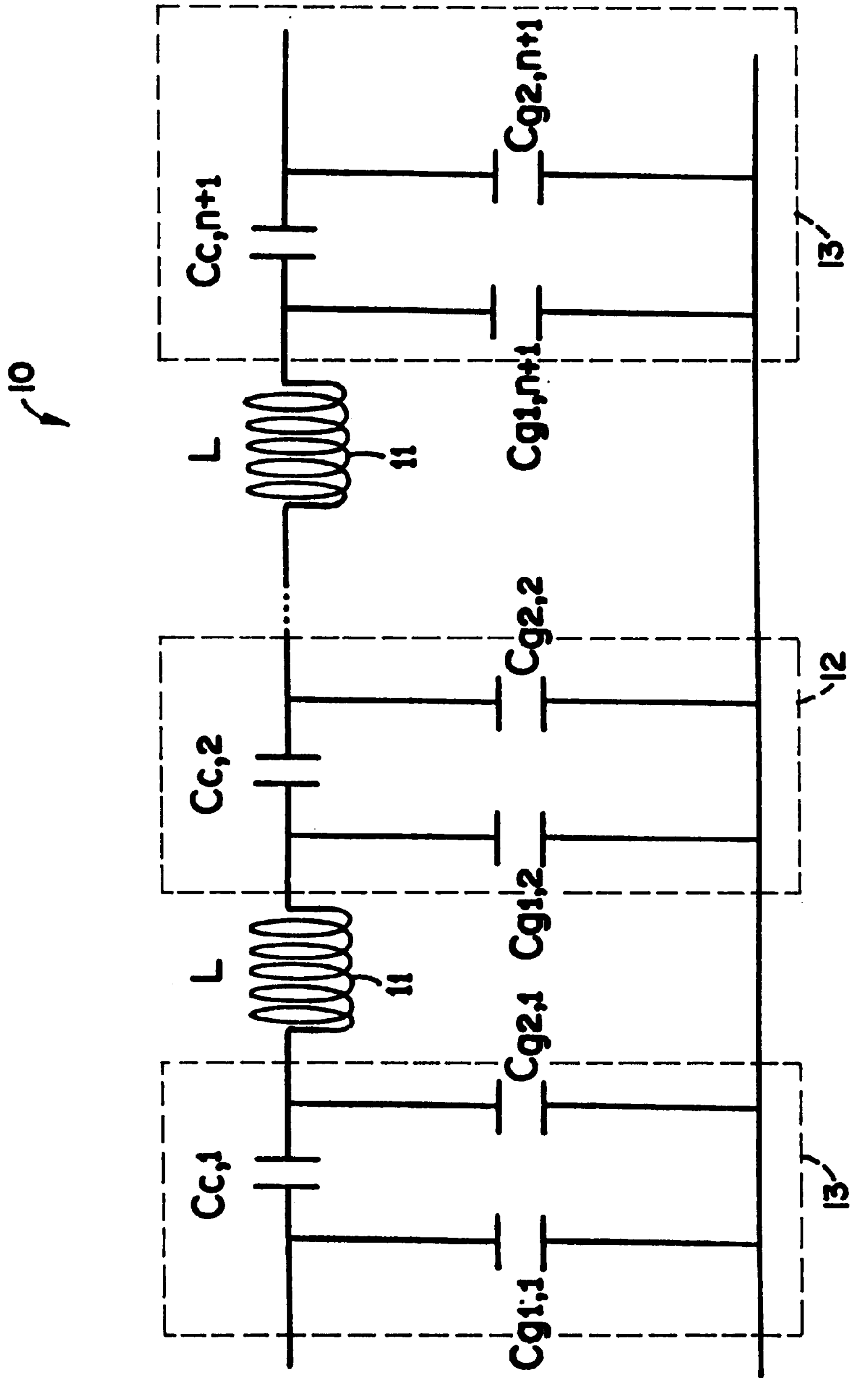
FIG. 1*a* is a circuit model of an nth-order lumped-element bandpass filter showing the tubular structure with all the inductors transformed to the same inductance value.

In order to more clearly describe the present invention, reference should first be made to FIG. 1*a* in which there is shown a tubular lumped-element bandpass filter circuit 10. In this lumped-element circuit 10, all inductors 11 are transformed to the same inductance value L. Between adjacent inductors 11, a π-capacitor network 12 is inserted. Similar π-capacitor networks 13 are also used at the input and output to match the appropriate circuit input and output impedances. For an n-pole bandpass filter, there are n identical inductors 11 and n+1 different π-capacitor networks 12, 13.

The total transmission response of the circuit, $S_{21}$, can be calculated from multiplication of the ABCD-matrix of each individual element followed by the conversion of the total ABCD-matrix to the scattering S-matrix.

Figure 1B:
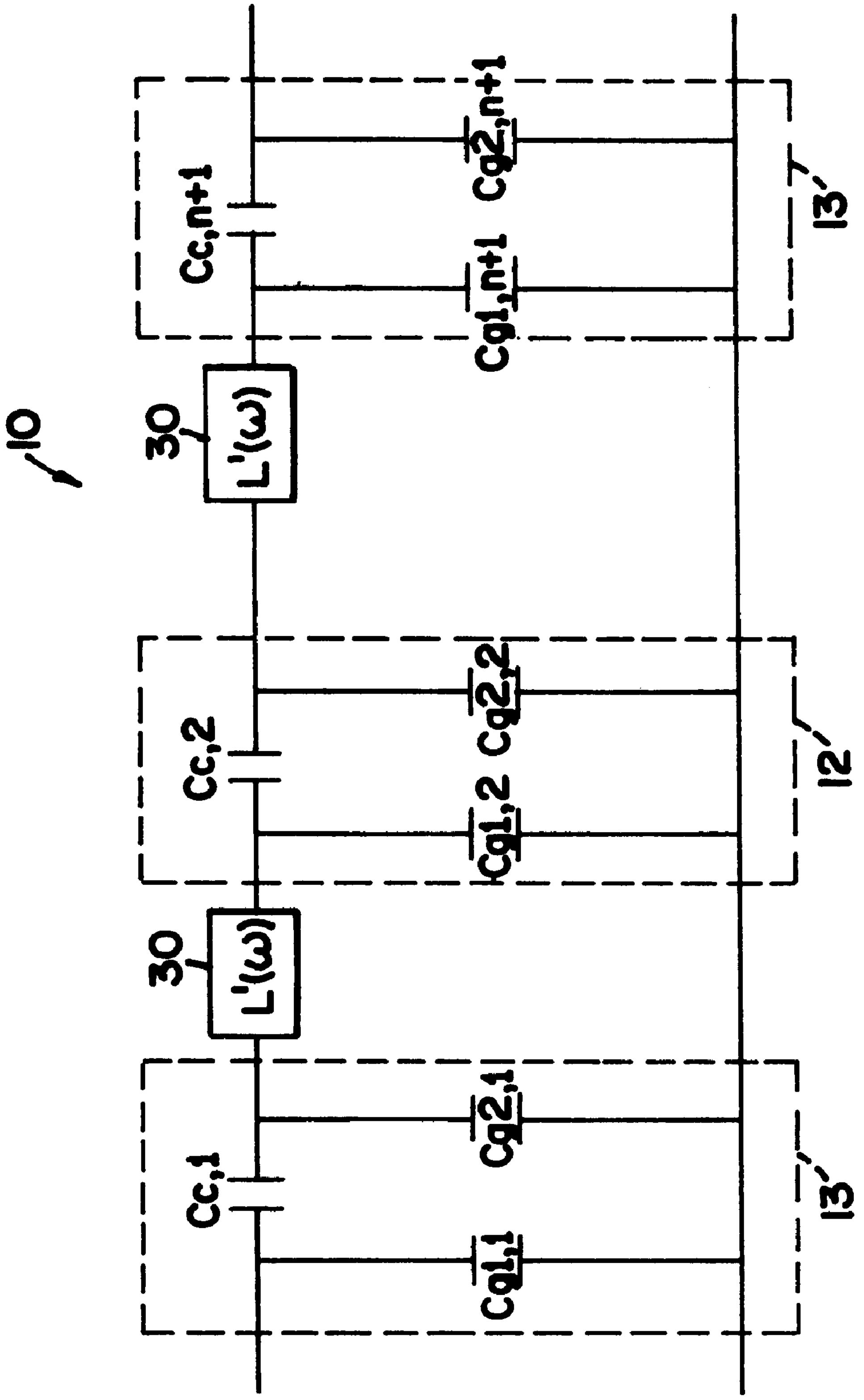
FIG. 1*b* is a circuit model of an nth order lumped-element bandpass filter with the L-C filter element apparatus shown as L'(ω).

First, assuming the ABCD-matrix of each inductor element is $A_L$, and those of the π-capacitor networks are $A_{\pi i}$, where i=1,2,3 . . . ,n+1, then:

$$A_L = \begin{bmatrix} 1 & j\omega L \\ 0 & 1 \end{bmatrix} \tag{1}$$

$$\begin{aligned} A_{\pi i} &= \begin{bmatrix} 1 & 0 \\ j\omega C_{g1,t} & 1 \end{bmatrix} \begin{bmatrix} 1 & \frac{1}{j\omega C_{c,t}} \\ 0 & 1 \end{bmatrix} \begin{bmatrix} 1 & 0 \\ j\omega C_{g2,1} & 1 \end{bmatrix} \\ &= \begin{bmatrix} 1+\frac{C_{g2,i}}{C_{c,t}} & \frac{1}{j\omega C_{c,t}} \\ j\omega\frac{(C_{c,i}C_{g1,i}+C_{c,i}C_{g2,i})}{C_{c,i}} & 1+\frac{C_{g1,i}}{C_{c,i}} \end{bmatrix} \end{aligned} \tag{2}$$

where i is the ith number of the π-capacitor networks, i=1,2,3 . . . ,n+1, $C_{c,i}$, as shown in FIG. 1, is the coupling capacitor, $C_{g1,i}$ and $C_{g2,i}$, also shown in FIG. 1, are the grounding capacitors for the same ith π-capacitor network.

The total ABCD-matrix of the filter circuit is then:

$$= \begin{bmatrix} a & b \\ c & d \end{bmatrix} \tag{3}$$

It is clear that the ABCD-matrix of a one-pole filter is:

$$A_1 = A_{\pi 1} A_L A_{\pi 2} = \begin{bmatrix} a_1 & \frac{jb_1}{\omega} \\ j\omega c_1 & d_1 \end{bmatrix} \tag{3a}$$

$$a_1 = \left(1 + \frac{C_{g2,1}}{C_{c,1}}\right)\left(1 + \frac{C_{g2,2}}{C_{c,2}} + \frac{(C_{gl,2}C_{c,2} + C_{gl,2}C_{g2,2} + C_{c,2}C_{g2,2})}{C_{c,1}C_{c,2}}[1 - (C_{c,1} + C_{g2,1})L\omega^2]\right)$$

$$b_1 = \frac{\left(1 + \frac{C_{gl,2}}{C_{c,2}}\right)[-1 + C_{c,1} + C_{g2,1})L\omega^2]}{C_{c,1}} - \frac{\left(1 + \frac{C_{g2,1}}{C_{c,1}}\right)}{C_{c,2}}$$

$$c_1 = \frac{(C_{gl,1}C_{c,1} + C_{gl,1}C_{g2,1} + C_{c,1}C_{g2,1})\left(1 + \frac{C_{g2,2}}{C_{c,2}}\right)}{C_{c,1}} + \frac{(C_{gl,2}C_{c,2} + C_{g2,2} + C_{c,2}C_{g2,2})}{C_{c,2}}\left[1 + \frac{C_{gl,1}}{C_{c,1}} - \frac{(C_{gl,1}C_{c,1} + C_{gl,1}C_{g2,1} + C_{c,1}C_{g2,1})}{C_{c,1}}L\omega^2\right]$$

$$d_1 = \frac{(C_{gl,1}C_{c,1} + C_{gl,1}C_{g2,1} + C_{c,1}C_{g2,1})}{C_{c,1}C_{c,2}} + \left(1 + \frac{C_{gl,2}}{C_{c,2}}\right)\left[1 + \frac{C_{gl,1}}{C_{c,2}} - \frac{(C_{g2,1}C_{c,1} + C_{g2,1} + C_{c,1}C_{g2,1})}{C_{c,1}}L\omega^2\right]$$

The ABCD-matrix of a two-pole filter is $A_2 = A_1 A_L A_{\pi 3} = A_1 A_{LC}$, which is the product of the one-pole ABCD-matrix and the ABCD-matrix of an inductor and a pi-capacitors, $A_{LC}$. The latter can be expressed as:

$$A_{LC} = A_L A_{\Pi 3} = \begin{bmatrix} a_{LC} & \frac{jb_{LC}}{\omega} \\ j\omega c_{LC} & d_{LC} \end{bmatrix} \tag{3b}$$

$$a_{LC} = 1 + \frac{C_{g2,3}}{C_{c,3}} - \frac{(C_{gl,3}C_{c,3} + C_{gl,3}C_{g2,3} + C_{c,3}C_{g2,3})L\omega^2}{C_{c,3}}$$

$$b_{LC} = \frac{[-1 + (C_{gl,3}C_{c,3})L\omega^2]}{C_{c,3}}$$

$$c_{LC} = \frac{(C_{gl,3}C_{c,3} + C_{gl,3}C_{g2,3} + C_{c,3}C_{g2,3})}{C_{c,3}}$$

$$d_{LC} = 1 + \frac{C_{gl,3}}{C_{c,3}}$$

Noting that $a_1$, $b_1$, $c_1$, $d_1$ and $a_{LC}$, $b_{LC}$, $c_{LC}$, $d_{LC}$ are only functions of $L\omega^2$, it may be concluded that the final two-pole ABCD-matrix, $A_2$, will also have the form of (3a). Furthermore, any i-pole filter ABCD-matrix can be expressed as the product of that of the (i-l)-pole and that of an inductor and a pi-capacitors, ALC. Cascading all the argument above, it can be shown that the matrix elements, a,b,c,d, of the total ABCD-matrix in (3), will have the following symmetry:

$$a = a_0 + a_1(L\omega^2) + a_2(L\omega^2)^2 + \ldots + a_n(L\omega^2)^n \tag{4}$$

$$b = \frac{1}{j\omega}\left[b_0 + b_1(L\omega^2) + b_2(L\omega^2)^2 + \ldots + b_n(L\omega^2)^n\right]$$

$$c = j\omega\left[c_0 + c_1(L\omega^2) + c_2(L\omega^2)^2 + \ldots + c_n(L\omega^2)^n\right]$$

$$d = d_0 + d_1(L\omega^2) + d_2(L\omega^2)^2 + \ldots + d_n(L\omega^2)^n$$

Where all coefficients, $a_i, b_i, c_i, d_i$, i=0,1,2,3 . . . ,n, are real numbers and functions of capacitance only, while the expression $L\omega^2$ is a common variable.

The S-matrix can be calculated from the above ABCD-matrix. Assuming the input and output impedance is $Z_1$ and $Z_2$, the frequency response of the filter, $S_{21}$, is then:

$$S_{21} = \frac{2\sqrt{Z_1 Z_2}}{Z_2 a + b + Z_1 Z_2 c + Z_1 d} \tag{5}$$

where a and d are pure real numbers, while b and c are pure imaginary numbers.

From Equations (4) and (5), it will be appreciated that if a frequency transformation can be employed, which keeps $L\omega^2$ invariant, then a and d, which contribute to the real part of the denominator in $S_{21}$, will be unchanged. Furthermore, if changes caused by the frequency transformation due to the $j\omega$ part in b and c are small enough, then the imaginary part of the denominator in $S_{21}$ will be invariant too. It should be noted that at the filter passband center, $\omega_o$, the frequency transformation factor is one (1). Therefore, the transmission response of the filter, $S_{21}$, will be unchanged after the frequency transformation is applied. The invariance of the imaginary part of the denominator in $S_{21}$ will be discussed below in this section.

The frequency transformation introduces a frequency-dependent inductance L'(ω) 30 to replace the untransformed inductance L. L'(ω) is selected to be equal to L at the filter passband center; that is, $L'(\omega_0)=L$. Because $S_{21}$ is unchanged by the frequency transformation, L'(ω) scales the frequency ω such that the bandwidth of the filter narrows when the slope is positive and expands when the slope is negative. This type of bandwidth transformation is very useful, especially for very narrow-band-filters in circuits having high circuit Qs where previously the difficulty of achieving weak coupling prevented the realization of super-narrow-bandpass filters.

To conduct such a transformation, another frequency domain, ω', is defined as follows:

$$L'(\omega)\omega^2 = L\omega'^2 \tag{6}$$

$$\text{or } \omega' = \sqrt{\frac{L'(\omega)}{L}}\,\omega \tag{7}$$

The transformation equation (7) insures the invariance of the filter response function, $S_{21}$, in ω' scale, compared to the original response function in ω scale before the transformation is carried out.

To calculate the filter real bandwidth after transformation, the derivative of (7) is taken, which yields:

$$d\omega' = d\left(\sqrt{\frac{L'(\omega)}{L}}\,\omega\right) = \sqrt{\frac{L'(\omega)}{L}}\,d\omega + \omega d\left(\sqrt{\frac{L'(\omega)}{L}}\right)$$

-continued $$= \left[\sqrt{\frac{L'(\omega)}{L}} + \frac{\omega}{L}\sqrt{\frac{L}{L'(\omega)}}\frac{dL'(\omega)}{d\omega}\right]d\omega$$

Using $L'(\omega_0)=L$, the bandwidth relationship is:

$$\Delta\omega' = \left[1 + \frac{\omega_0}{L}\frac{dL'(\omega)}{d\omega}\bigg|_{\omega_0}\right]\Delta\omega$$

where $\Delta\omega'$ is the bandwidth in $\omega'$ domain (which is also the original filter bandwidth, $\Delta\omega_0$, before the transformation due to the invariance of the response function), while $\Delta\omega$ is the new real bandwidth after the transformation. Thus, the new bandwidth after the transformation is calculated as:

$$\frac{\Delta\omega}{\omega_0} = \frac{1}{1 + \frac{\omega_0}{L}\frac{dL'(\omega)}{d\omega}\Big|_{\omega_0}}\frac{\Delta\omega_0}{\omega_0} \tag{8}$$

Equation (8) shows that the filter bandwidth is transformed by a factor of:

$$\left[1 + \frac{\omega_0}{L}\frac{dL'(\omega)}{d\omega}\bigg|_{\omega_0}\right]^{-1}.$$

To prove that the change in the $j\omega$ term in b and c due to the frequency transformation is small enough to be neglected, the following terms are defined:

$$B = [b_0 + b_1(L\omega^2) + b_2(L\omega^2)^2 + \ldots + b_n(L\omega^2)^n] \tag{9}$$
$$C = [c_0 + c_1(L\omega^2) + c_2(L\omega^2)^2 + \ldots + c_n(L\omega^2)^n]$$

Resulting in:

$$b = \frac{1}{j\omega}B(\omega) = \sqrt{\frac{L'(\omega)}{L}}\frac{1}{j\omega'}B(\omega') \tag{10}$$
$$c = j\omega C(\omega) = \sqrt{\frac{L}{L'(\omega)}}j\omega' C(\omega')$$

In the narrow-band approximation, $L'(\omega)$ takes the form $L'(\omega)=L[1+k(\omega-\omega_0)]$, where k is the slope coefficient which is very small, $|k(\omega-\omega_0)|<<1$. Therefore, the following may be approximated:

$$b \approx \left[1 + \frac{k}{2}(\omega-\omega_0)\right]\frac{1}{j\omega'}B(\omega') \tag{11}$$
$$c \approx \left[1 - \frac{k}{2}(\omega-\omega_0)\right]j\omega' C(\omega')$$

Then the imaginary part in the denominator of equation (5) is:

$$b(\omega) + Z_1Z_2c(\omega) = \left[1 + \frac{k}{2}(\omega-\omega_0)\right]\frac{1}{j\omega'}B(\omega') + Z_1Z_2\left[1 - \frac{k}{2}(\omega-\omega_0)\right]j\omega' C(\omega')$$

-continued $$= \frac{1}{j\omega'}B(\omega') + Z_1Z_2j\omega'C(\omega') + \frac{k}{2}(\omega-\omega_0)\left[\frac{1}{j\omega'}B(\omega') - Z_1Zj\omega'C(\omega')\right]$$
$$= b(\omega') + Z_1Z_2c(\omega') + \frac{k}{2}(\omega-\omega_0)\left[\frac{1}{j\omega'}B(\omega') - Z_1Zj\omega'C(\omega')\right]$$
$$\approx b(\omega') + Z_1Z_2c(\omega'), \text{ where } |k(\omega-\omega_o)| \ll 1.$$

It can be seen from the expression $L'=L[1+k(\omega-\omega_0)]$ that where the value of k is positive the inductance L' is larger than L when $\omega>\omega_0$ and smaller than L when $\omega<\omega_0$. This transformation moves both the upper and lower 3-dB points toward the center of the passband, thus reducing the bandwidth of the filter. This is a general design rule applicable to any type of filter design, such as lumped element and cavity filters.

Working Example

An example circuit which demonstrates the frequency transformation concept of the present invention is next described. The specifications of the desired filter are as follows: a microstrip filter centered at $f_o$=900 MHz with 5 poles, fractional bandwidth w=0.28%, and passband ripple $L_r$=0.05 dB.

If a Chebyshev response is considered, this filter will require a weakest coupling of −51.1 dB. This coupling level is hard to reach in a microstrip configuration due to the normally poor isolation between resonators. Filter resonator elements will then have to be placed very far apart to achieve this weak coupling level. For even narrower bandwidth filters such as 0.05%, the weakest coupling must be only −66.1 dB. It is virtually impossible to build a 0.05% filter in microstrip form using the conventional coupling scheme since the feedthrough of a typical 2" filter is nearly −60 dB.

However, if a similar filter is considered with the same specifications except that the fractional bandwidth is now 1% instead of 0.28%, then this 1% filter will require a weakest coupling of −40 dB, which is achievable in microstrip form. Starting with this 1% filter design and using the tubular topology as illustrated in FIG. 1*a*, followed by a replacement of a frequency dependent inductor $L'(\omega)$ in the designed circuit, a new filter which has an appropriate bandwidth of 0.28% is achieved.

Figure 2A:
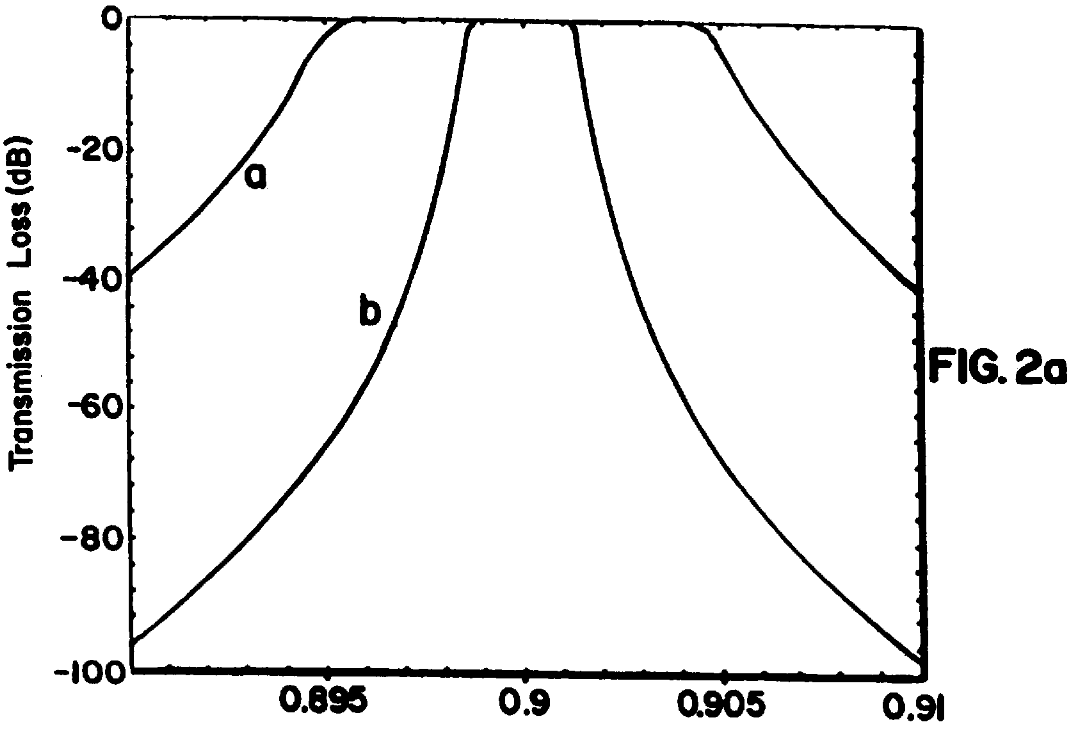
FIG. 2*a* is a graphical illustration of the transmission response of a 5th-order embodiment of the filter of FIG. 1*a*, wherein curve a is the response of the original filter and curve b is the response of the filter after all the inductors in FIG. 1 are replaced with frequency-dependent values, as $L'=L+k\ (f-f_0)$.
Figure 2B:
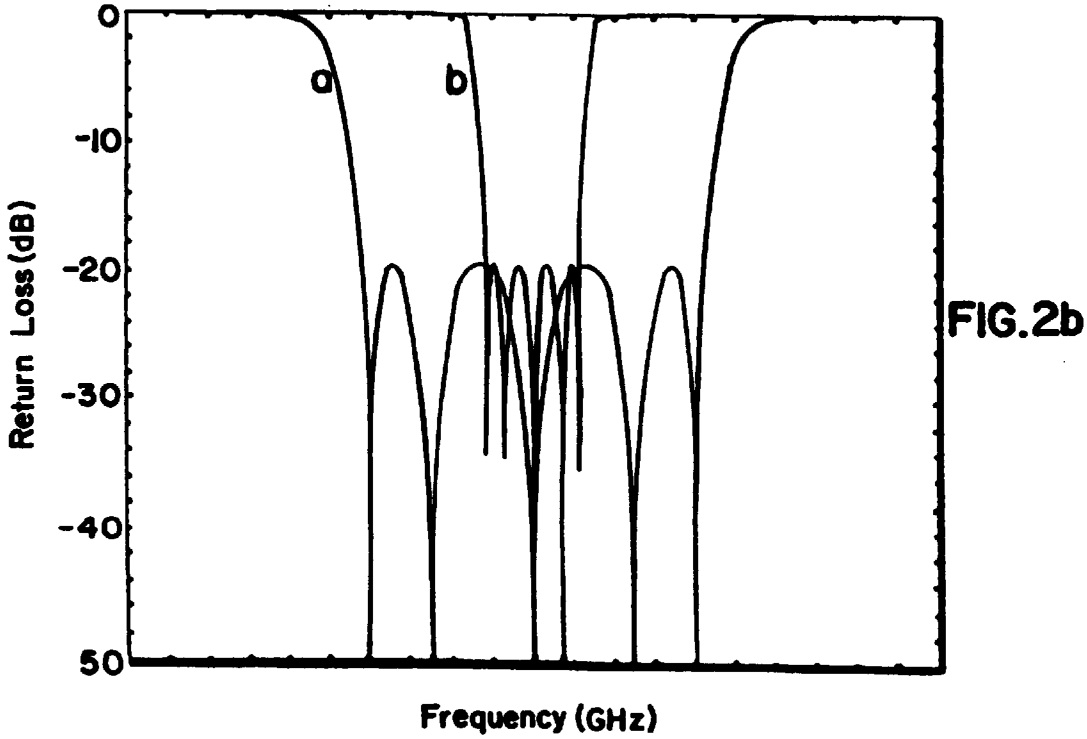
FIG. 2*b* is a graphical illustration of the reflection of the filter response of FIG. 1*a*.

The transmission and return loss response of this 1% filter is shown in curves a in FIGS. 2*a* and 2*b*. Also shown in FIGS. 2*a* and 2*b* are curves b which are the responses of the filter after the frequency transformation, whose inductance value is $L'(\omega)=L[1+k(\omega-\omega_0)]$, with $k=9.085\times10^{-4}$/MHz and L=17.52 nH.

From those response curves, it is illustrated that the Chebyshev approximation is conserved, while the bandwidth of the filter is reduced through the frequency transformation from 1% to 0.28%, which is exactly the value calculated from Equation 8 using the k and L values provided.

Figure 5A:
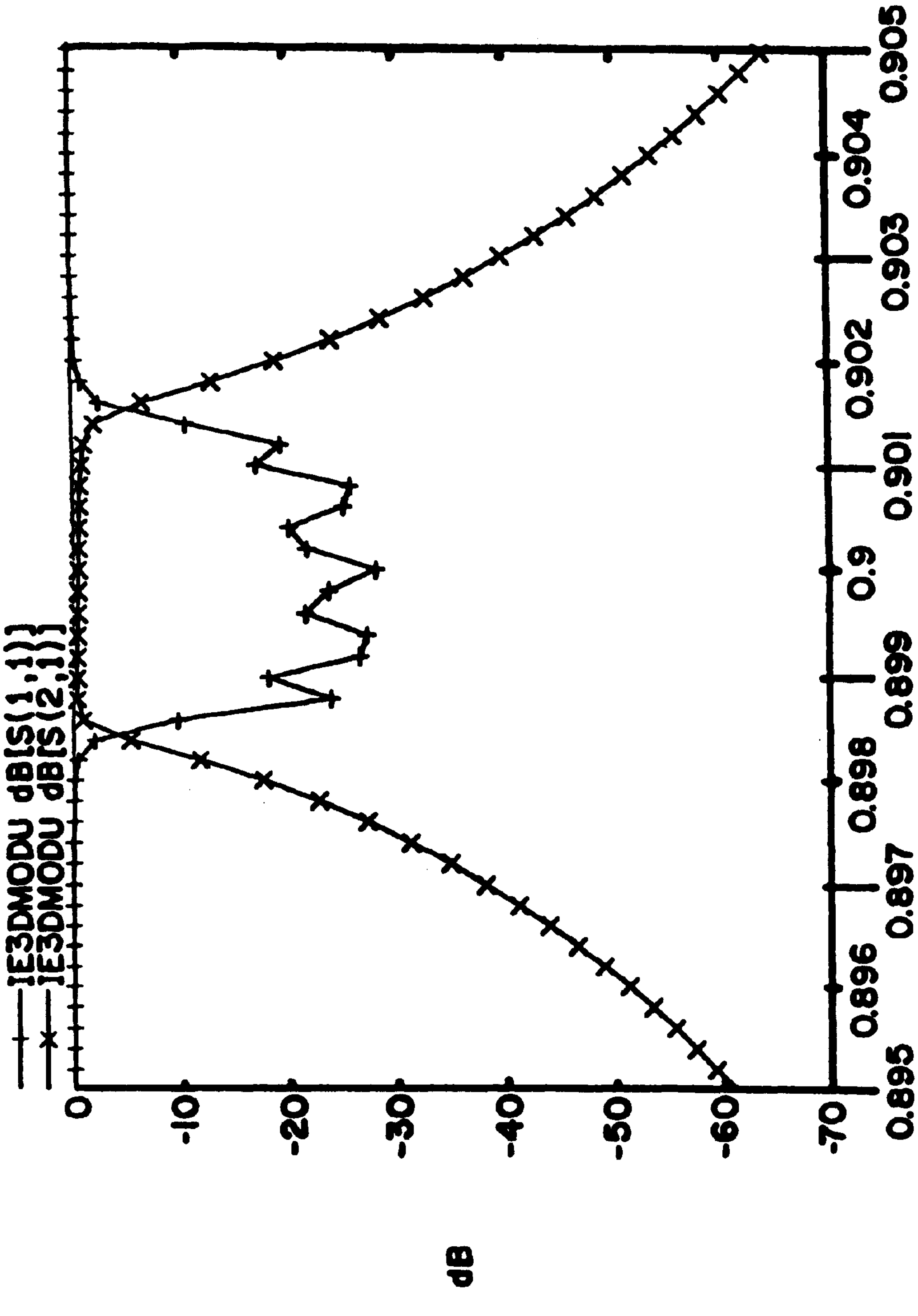
FIG. 5*a* illustrates a graph of the electromagnetic modular simulation of the 0.05% bandwidth filter shown in FIG. 4.
Figure 5B:
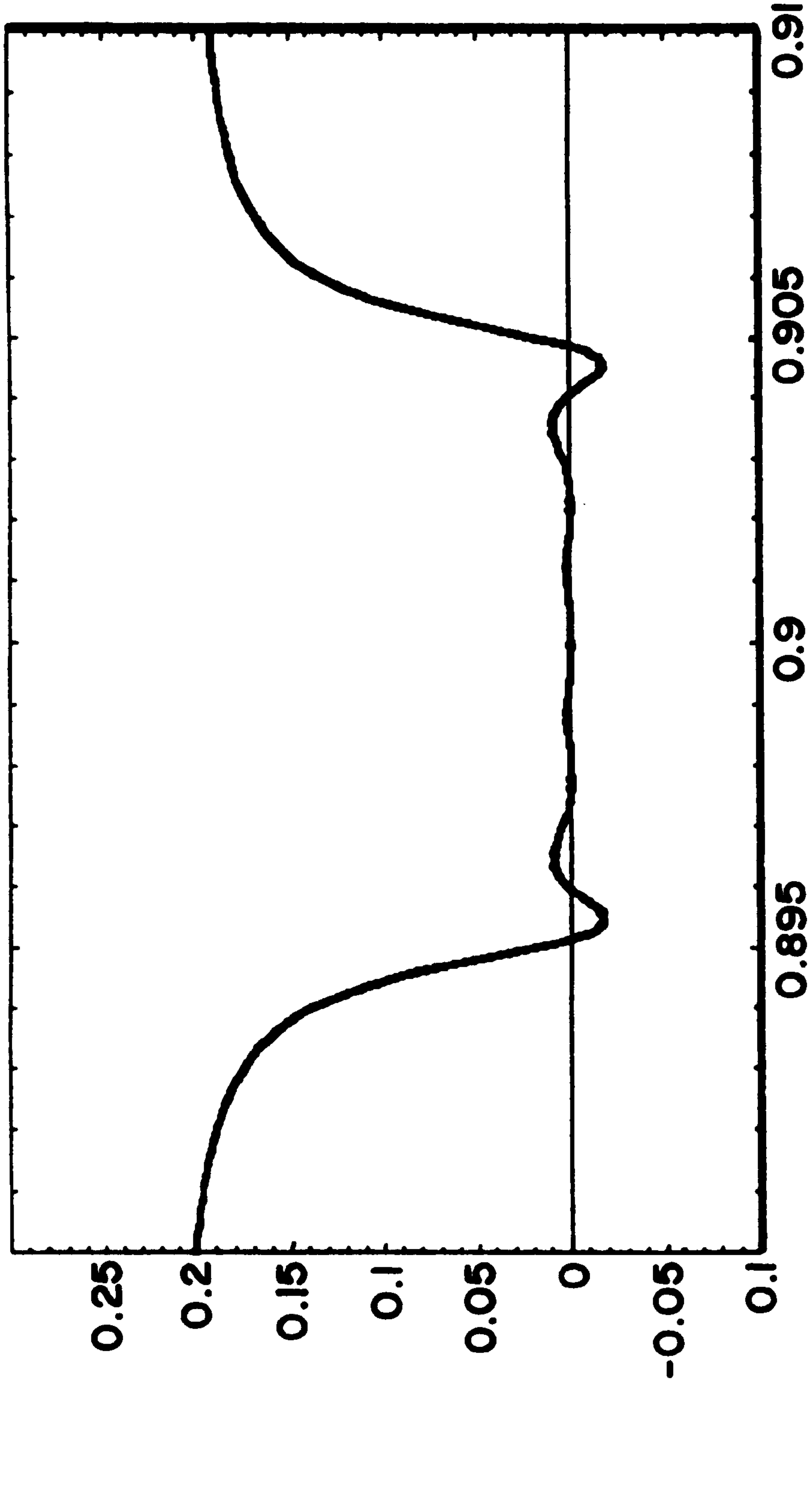
FIG. 5*b* illustrates a graph of the deviation of an example Chebyshev response between a 0.28% filter in the ω' domain and that of a 1% filter in the ω domain.

The deviation of the transmission responses between this 0.28% transformed filter in $\omega'$ domain and that of the original 1% filter in $\omega$ domain is calculated and plotted in FIG. 5*b*. Within the passband, the maximum deviation from the original Chebyshev function form is less than 0.02 dB, while that of the passband is less than 0.2 dB at 40 dB rejection. This demonstrates that the Chebyshev function is well conserved even after a 4 times reduction in bandwidth.

Realization of the Frequency-Dependent L-C Values

An important concept in the present invention is the control of the slope of the inductor values as a function of the frequency. The inductor value as a function of the frequency is denoted by L(f). In the usual transmission line realization of inductors, the inductor slope parameter k has a negative value because of the capacitance to ground. In order to achieve positive k values, which gives bandwidth transformation to the narrower side, other L(f) mechanisms have to be introduced in the circuit.

One simple realization of L(f) with a positive k could be a single capacitor C in parallel with an inductor $L_o$. From the resultant impedance $Z_{eq}$:

$$\frac{1}{Zeq} = \frac{1}{j\omega L_0} + j\omega C$$

$$Zeq = j\omega L'$$

Figure 3:
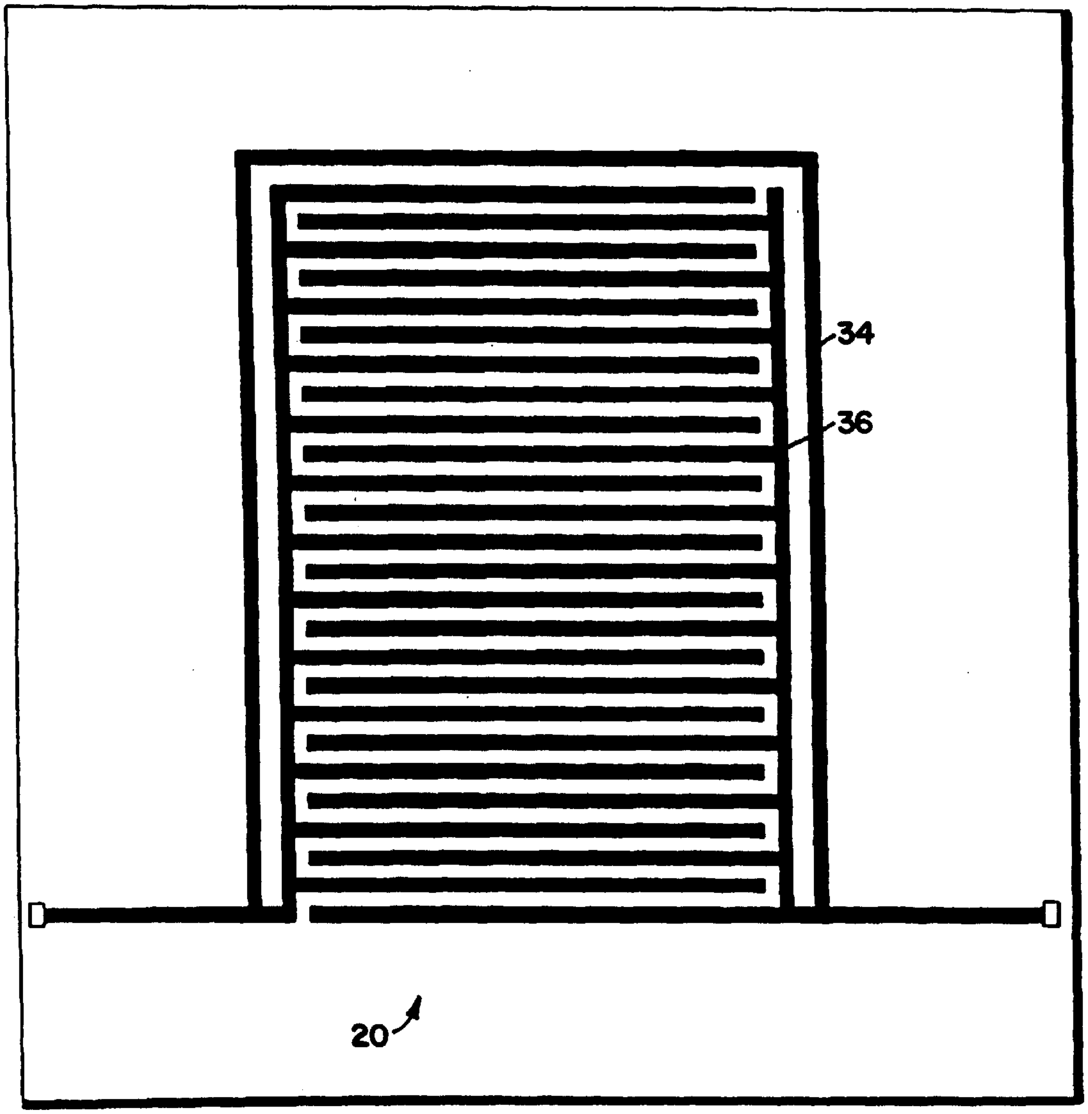
FIG. 3 is an example of a layout of the frequency-dependent inductor realization.
Figure 4:
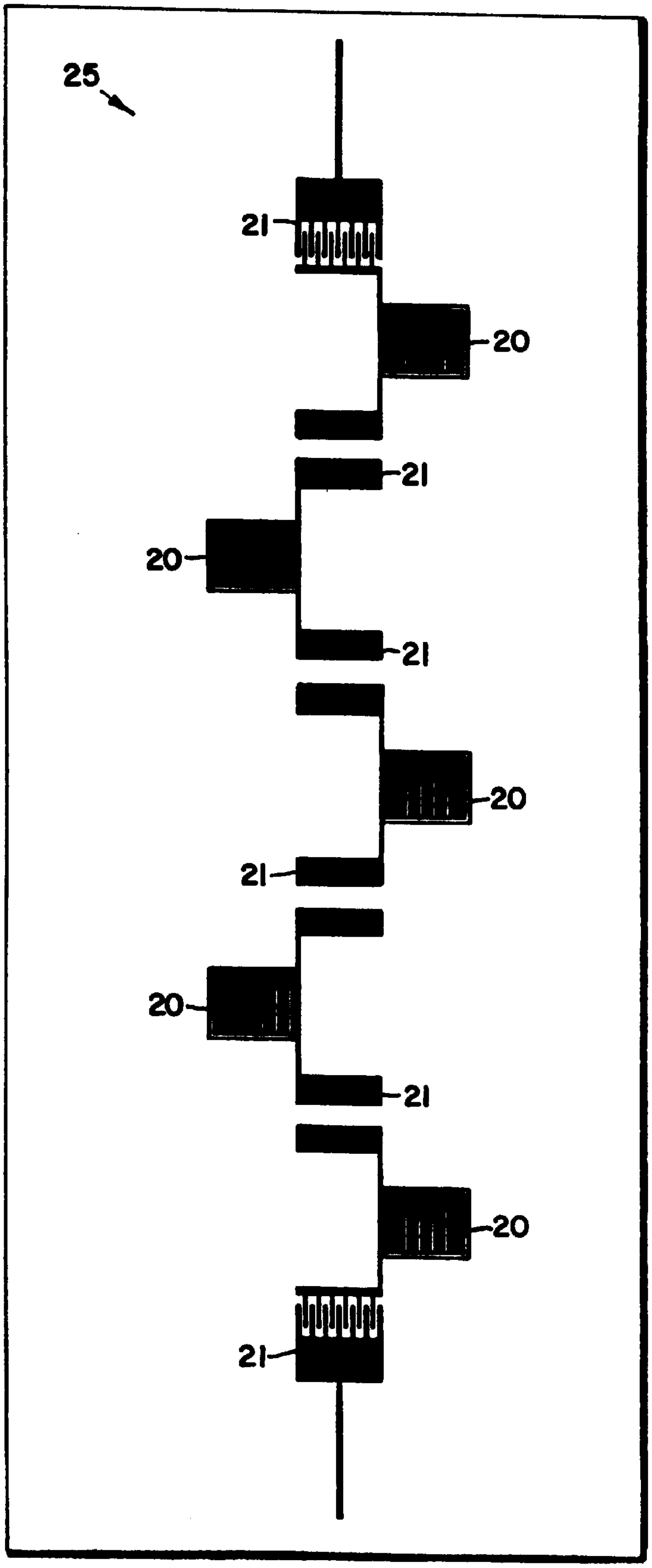
FIG. 4 illustrates a bandpass filter layout designed using a preferred construction which embodies the principles of the present invention.

The equivalent inductance at the low-side can be calculated:

$$\omega' = \frac{1}{\sqrt{L_0 C}} \quad (12)$$

$$\begin{aligned} L' &= \frac{L_0}{1 - \omega^2 L_0 C} \quad (13) \\ &\approx L_0(1 + \omega^2 L_0 C) \\ &\approx L_0(1 + \omega_0^2 L_0 C) + 2\omega_0 L_0^2 C(\omega - \omega_0) \end{aligned}$$

where $L_0$ is the inductance of the inductor itself and C is the series capacitance of the capacitor in parallel with the inductor. The slope parameter $k=4\pi\omega_0 L^2_0 C$, has a positive value. This parallel L-C component can easily be realized using a half loop of an inductor 34 in parallel with an interdigital capacitor 36 as in FIG. 3. A 5th order lumped-element filter design layouts using this approach, with a bandwidth of 0.28% is shown in FIG. 4. As may be seen from Equation (13), the effective inductance of L' is much larger than the inductance of the original parallel inductor L. It is this larger effective inductance and the frequency dependence of this value that makes it possible to realize very narrow-band filters.

FIG. 5*a* is a graph of the frequency response of the 0.05% bandwidth filter shown in FIG. 4. This plot comes from a simulation of the circuit and demonstrates the narrow pass-band of the transmission response.

Figure 6:
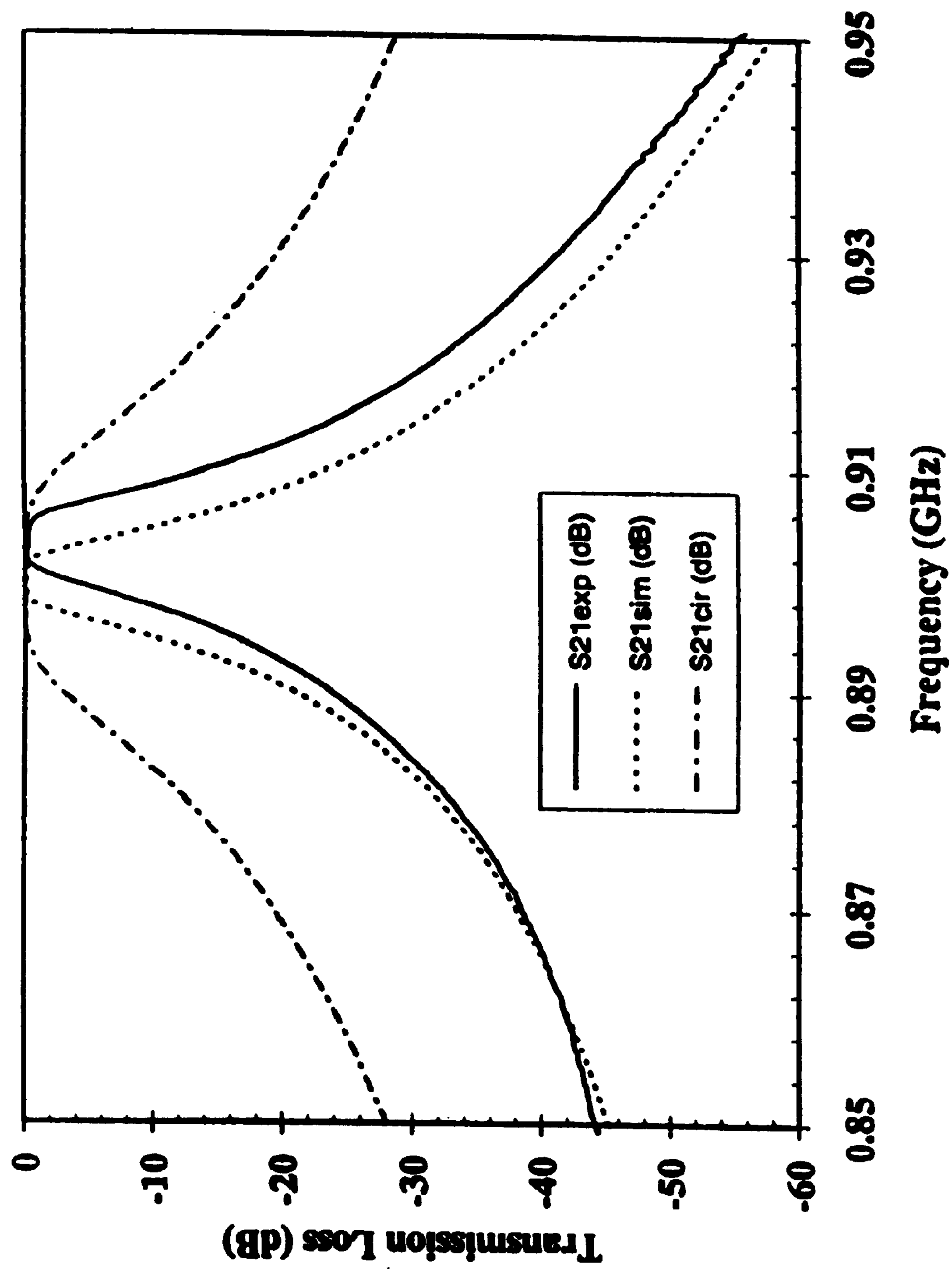
FIG. 6 illustrates a graph of a two-pole filter constructed in accordance with the principles of the present invention.

FIG. 6 illustrates actual test data from a experimentally measured 2-pole filter constructed in accordance with the principles of the present invention. The $S_{21cir}$(dB) curve represents the frequency response of a circuit without the frequency transformation. The $S_{21sim}$(dB) curve represents the simulated frequency response of the circuit with the frequency transformation. Lastly, the $S_{21exp}$(dB) curve represents the frequency response of an actual circuit with the frequency transformation included. The fingers of the inductive element form the capacitive element. FIG. 3 illustrates an interdigitized inductor 20 which is utilized in a preferred embodiment of the present invention. The test data illustrated in FIG. 6 utilized inductors constructed in this manner. Additionally, FIG. 4 illustrates a five pole device 25 which includes n (e.g., five) inductor 20 elements and n+1 (e.g., six) capacitor 21 elements. The test data illustrated in FIG. 6 utilized a 2-pole layout which was similar to the five-pole layout illustrated in FIG. 4.

The filter devices of the invention are preferably constructed of materials capable of yielding a high circuit Q filter, preferably a circuit Q of at least 10,000 and more preferably a circuit Q of at least 40,000. Superconducting materials are suitable for high Q circuits. Superconductors include certain metals and metal alloys, such a niobium as well as certain perovskite oxides, such as $YBa_2Cu_3O_{7-\delta}$ (YBCO), where δ is a number between 0 and 1. Methods of deposition of superconductors on substrates and of fabricating devices are well known in the art, and are similar to the methods used in the semiconductor industry.

In the case of high temperature oxide superconductors of the perovskite-type, deposition may be by any known method, including sputtering, laser ablation, chemical deposition or co-evaporation. The substrate is preferably a single crystal material that is lattice-matched to the superconductor. Intermediate buffer layers between the oxide superconductor and the substrate may be used to improve the quality of the film. Such buffer layers are known in the art, and are described, for example, in U.S. Pat. No. 5,132,282 issued to Newman et al., which is hereby incorporated herein by reference. Suitable dielectric substrates for oxide superconductors include sapphire (single crystal $Al_2O_3$) and lanthanum aluminate ($LaAlO_3$).

It is to be understood that even though numerous characteristics and advantages of the present invention have been set forth in the foregoing description, together with details of the structure and function of the invention, the disclosure is illustrative only and changes may be made in detail. Other modifications and alterations are well within the knowledge of those skilled in the art and are to be included within the broad scope of the appended claims.

What is claimed is:

1. An electrical filter apparatus of the type having at least two pi-capacitor networks and for receiving an electrical signal having frequency components, comprising:

a. a capacitive element;

b. an inductive element having an initial inductance, operatively connected to said capacitive element, wherein the combination of said capacitive element and said inductive element provides an effective inductance which is larger than said initial inductance and said effective inductance increases with corresponding increases in the frequency of the frequency components of the electrical signal; and c. wherein the combination of said capacitive element and said inductive element is operatively connected between two of said pi-capacitor networks.

2. The electrical filter apparatus of claim 1, wherein said effective inductance is L'; which is defined as:

$$L'=(L_o)/(1-\omega^2 L_o C)$$

wherein $L_o$ is said initial inductance, w is the frequency of the signal, and C is the capacitance of said capacitive element.

3. The electrical filter apparatus of claim 1, wherein said capacitive element and said inductive element are each comprised of a respective conductive material on a first side of a dielectric substrate.

4. The electrical filter apparatus of claim 3, further comprising a second conductive material on an opposite side of said substrate.

5. The electrical filter apparatus of claim 3, wherein said substrate is comprised of either lanthanum aluminate or sapphire.

6. The electrical filter apparatus of claim 1, wherein said inductive element and said capacitive element are each comprised of a respective superconductor component.

7. The electrical filter apparatus of claim 6, wherein said respective superconductor component is a niobium superconductor.

8. The electrical filter apparatus of claim 6, wherein said respective superconductor component is an oxide superconductor.

9. The electrical filter apparatus of claim 8, wherein said oxide superconductor is YBCO.

10. The electrical filter apparatus of claim 1, wherein the filter apparatus is characterized as having a circuit Q of at least 10,000.

11. The electrical filter apparatus of claim 10, wherein the filter apparatus is characterized as having a circuit Q of at least 40,000.

12. The electrical filter apparatus of claim 1, wherein said capacitive element and said inductive element comprise a lumped element device.

13. The electrical filter apparatus of claim 12, wherein said capacitive element is comprised of interdigitized fingers connected in parallel to said inductive element.

14. A bandpass filter, comprising:

a. a plurality of frequency variable inductors for receiving an electrical signal having frequency components, each of said frequency variable inductors comprising a respective inductive element, having a corresponding initial inductance and a respective capacitive element in parallel with said corresponding inductive element, so that the respective combination of said inductive element and said capacitive element provides a respective effective inductance, L', which is defined as:

$$L'=(L_o)/(1-\omega^2 L_o C)$$

wherein $L_o$ is said respective initial inductance, ω is the frequency of the signal, and C is the capacitance of said respective capacitive element of the corresponding frequency variable inductors; and b. a plurality of pi-capacitive elements respectively interposed between said respective frequency variable inductors, whereby a lumped-element filter is realized.

15. The bandpass filter of claim 14, wherein said frequency variable inductors and said pi-capacitive elements are each comprised of a respective conductive material on one side of a dielectric substrate, and wherein a second conductive material is located on an opposite side of said substrate.

16. The bandpass filter of claim 15, wherein said substrate is comprised of either lanthanum aluminate or sapphire, wherein said frequency variable inductors and said pi-capacitive elements are each comprised of either niobium or an oxide superconductor, and wherein the filter is characterized as having a circuit Q of at least 10,000.

17. The bandpass filter of claim 14, wherein said respective capacitive elements of each said L-C filter elements are comprised of interdigitized fingers connected in parallel to said corresponding inductive element.

18. The method of claim 17, wherein the respective capacitor of the corresponding frequency variable inductor comprises respective interdigitized fingers in parallel with the inductor of the corresponding frequency variable inductor.

19. A method of narrowing the passband of an electrical filter, wherein the electrical filter comprises a reactive element connected between two pi-capacitor networks, and the reactive element comprises an inductive element and a capacitive element in parallel with one another, the method comprising the steps of:

selecting a value for the capacitive element; and selecting a value for the inductive element, wherein the selected capacitive element value and the selected inductive element value result in the reactive element having a frequency varying inductance wherein the inductance of the reactive element increases with increases in the frequency of the signal.

20. A method of filtering electrical signals, comprising the steps of:

a) connecting a plurality of frequency variable inductors to one another, each of said frequency variable inductors comprising a respective inductor, said respective inductor having a corresponding initial inductance and a respective capacitor operatively connected to said corresponding inductor, wherein the respective combination of said capacitor and said inductor has a respective effective inductance; and wherein said respective effective inductance of each of said frequency variable inductors is larger than said respective initial inductance of said corresponding inductor and said respective effective inductance increases with corresponding increases in frequency of the signal; and b) interposing a plurality of pi-capacitive elements between said respective frequency variable inductors.

21. A bandpass filter for receiving an electrical signal having frequency components, comprising:

a. a plurality of pi-capacitor elements operatively connected to each other;

b. a reactive element having an initial inductance, said reactive element operatively connected between two of said pi-capacitor elements, wherein said reactive element has an impedance that varies nonlinearly as the frequency components of the electrical signal vary; and c. wherein said reactive element has an effective inductance which varies from said initial inductance and said effective inductance increases with corresponding increases in the frequency of the frequency components of the electrical signal and decreases with corresponding decreases in the frequency of the frequency components of the signal.

22. The filter of claim 21, wherein said reactive element is comprised of an inductor and a capacitor operatively connected to one another in parallel.

* * * * *

UNITED STATES PATENT AND TRADEMARK OFFICE

CERTIFICATE OF CORRECTION

PATENT NO. : 6,438,394 B1 Page 1 of 1
DATED : August 20, 2002
INVENTOR(S) : Zhang et al.

It is certified that error appears in the above-identified patent and that said Letters Patent is hereby corrected as shown below:

Title page,
Item [73], please insert the assignee as follows:
-- [73] Assignee: Conductus, Inc., Sunnyvale, California --

Column 4,
Lines 64-65, equation 3: "$= \begin{bmatrix} a & b \\ c & d \end{bmatrix}$" should read --$A = A_{\pi 1} A_L A_{\pi 2} \ldots A_L A_{\pi, i+1} \ldots A_L A_{\pi, n+1} = \begin{bmatrix} a & b \\ c & d \end{bmatrix}$--

Signed and Sealed this

Twenty-third Day of December, 2003

JAMES E. ROGAN
*Director of the United States Patent and Trademark Office*